(12) United States Patent
Zhang et al.

(10) Patent No.: US 11,804,837 B1
(45) Date of Patent: Oct. 31, 2023

(54) SWITCH CIRCUIT AND POWER MODULE

(71) Applicant: Delta Electronics, Inc., Taipei (TW)

(72) Inventors: Boyi Zhang, Taipei (TW); Ruxi Wang, Apex, NC (US); Peter Mantovanelli Barbosa, Cary, NC (US)

(73) Assignee: DELTA ELECTRONICS, INC., Taipei (TW)

( * ) Notice: Subject to any disclaimer, the term of this patent is extended or adjusted under 35 U.S.C. 154(b) by 0 days.

(21) Appl. No.: 17/840,863

(22) Filed: Jun. 15, 2022

(51) Int. Cl.
*H03K 17/687* (2006.01)
*H03K 17/12* (2006.01)
*H02M 1/088* (2006.01)

(52) U.S. Cl.
CPC .......... *H03K 17/687* (2013.01); *H02M 1/088* (2013.01); *H03K 17/122* (2013.01)

(58) Field of Classification Search
CPC ............... H03K 17/687; H03K 17/122; H03K 17/6871; H03K 17/6872; H03K 17/6874; H02M 1/088
See application file for complete search history.

(56) References Cited

U.S. PATENT DOCUMENTS

| | | | |
|---|---|---|---|
| 9,503,079 B1 | 11/2016 | Wang | |
| 9,923,560 B2 | 3/2018 | Wang et al. | |
| 10,250,115 B2 | 4/2019 | Xu et al. | |
| 11,075,589 B2 | 7/2021 | Xu et al. | |
| 2020/0321796 A1* | 10/2020 | Chang | H02M 1/10 |

FOREIGN PATENT DOCUMENTS

| | | |
|---|---|---|
| CN | 103905018 A | 7/2014 |
| CN | 110061648 A | 7/2019 |
| TW | I555197 B | 10/2016 |

\* cited by examiner

*Primary Examiner* — Jung Kim
(74) *Attorney, Agent, or Firm* — KIRTON MCCONKIE; Evan R. Witt

(57) ABSTRACT

A switch circuit electrically connected to a power source and a first control source and including a plurality of switch bridge arms is provided. Each of the plurality of switch bridge arms includes a first switch and a second switch electrically connected in series. A loop formed by the first switch, the second switch and the power source is defined as a power loop. A loop formed by the first control source and the first switch is defined as a first control loop. A first mutual inductance is formed between the power loop and the first control loop. Among all the first switches, the first switch with the longer power loop has the smaller first mutual inductance.

8 Claims, 6 Drawing Sheets

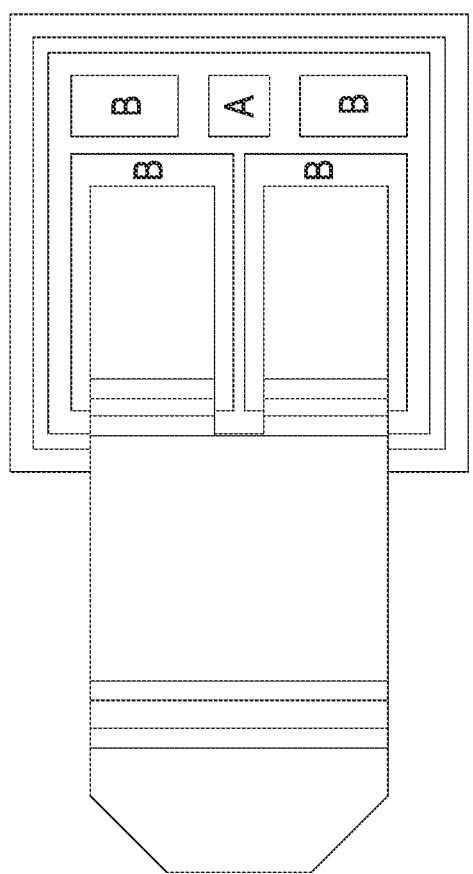

SWITCH CIRCUIT AND POWER MODULE

FIELD OF THE INVENTION

The present disclosure relates to a switch circuit and a power module, and more particularly to a switch circuit and a power module capable of balancing the dynamics currents flowing through the switches.

BACKGROUND OF THE INVENTION

High capacity and high power density power electronics systems are increasingly demanded in transportation electrification and smart grid applications. With the recent development of SiC devices, power electronics systems are able to achieve high efficiency and high power density. However, the thermal-mechanical stress of the die limits the active area of a single chip. As a result, the current rating of a single device is limited. Paralleling multiple power devices has become an inevitable way to increase the current capability of the power electronics system.

The major issue of paralleling devices is that the current shared by the paralleled devices is not balanced. Due to the asymmetrical layout, the parasitic inductances of the paralleled devices are different. During switching transient, the dynamic currents flowing through the paralleled devices are different. The dynamic current unbalance between the paralleled devices leads to gate voltage oscillation, overcurrent, and thermal stress unbalance, which could cause unstable oscillation and thermal runaway and eventually lead to system failure.

Therefore, there is a need of providing a switch circuit and a power module to obviate the drawbacks encountered from the prior arts.

SUMMARY OF THE INVENTION

It is an objective of the present disclosure to provide a switch circuit and a power module capable of balancing the dynamic currents flowing through the switches based on the common source inductance. Due to the balanced dynamic currents, the reliability of the switch circuit and the power module is greatly improved.

In accordance with an aspect of the present disclosure, there is provided a switch circuit electrically connected to a power source and a first control source. Each of the power source and the first control source has a first end and a second end. The switch circuit includes a plurality of switch bridge arms electrically connected in parallel, each including a first switch and a second switch electrically connected in series. Midpoints of the plurality of switch bridge arms are connected together. Each of the first switch and the second switch has a first terminal, a second terminal, and a third terminal. In each of the plurality of switch bridge arms, the first terminal of the first switch is electrically connected to the first end of the power source, and the second terminal and the third terminal of the first switch are electrically connected to the second end and the first end of the first control source respectively. The first terminal and the second terminal of the second switch are electrically connected to the second terminal of the first switch and the second end of the power source respectively. A loop formed by the first switch, the second switch and the power source is defined as a power loop. A loop formed by the first control source and the second terminal and the third terminal of the first switch is defined as a first control loop. A first mutual inductance is formed between the power loop and the first control loop. Among all the first switches, the first switch with the longer power loop has the smaller first mutual inductance.

In accordance with another aspect of the present disclosure, there is provided a power module including a first power pin, a second power pin, a first control pin, a second control pin, and a plurality of switch bridge arms. The first power pin and the second power pin are configured to receive a power. The first control pin and the second control pin are configured to receive a first control signal. The plurality of switch bridge arms are electrically connected in parallel, each including a first switch and a second switch electrically connected in series. Midpoints of the plurality of switch bridge arms are connected together. Each of the first switch and the second switch has a first terminal, a second terminal and a third terminal. In each of the plurality of switch bridge arms, the first terminal, the second terminal and the third terminal of the first switch are electrically connected to the first power pin, the second control pin and the first control pin respectively, and the first terminal and the second terminal of the second switch are electrically connected to the second terminal of the first switch and the second power pin respectively. A loop formed by the first power pin, the first switch, the second switch and the second power pin is defined as a power loop. A loop formed by the first control pin, the second terminal and the third terminal of the second switch, and the second control pin is defined as a first control loop. A first mutual inductance is formed between the power loop and the first control loop. Among all the first switches, the first switch with the longer power branch has the smaller first mutual inductance.

In accordance with another aspect of the present disclosure, there is provided a switch circuit electrically connected to a power source and a first control source. Each of the power source and the first control source has a first end and a second end. The switch circuit includes a plurality of switch bridge arms electrically connected in parallel, each including a first switch, a first interconnection conductor, a second switch, and a second interconnection conductor electrically connected in series sequentially. Midpoints of the plurality of switch bridge arms are connected together. Each of the first switch and the second switch has a first terminal, a second terminal, and a third terminal. In each of the plurality of switch bridge arms, the first terminal and the second terminal of the first switch are electrically connected to the first end of the power source and a first terminal of the first interconnection conductor respectively. The first terminal and the second terminal of the second switch are electrically connected to a second terminal of the first interconnection conductor and a first terminal of the second interconnection conductor respectively. A second terminal of the second interconnection conductor is electrically connected to the second end of the power source. The third terminal of the first switch and the second terminal of the first interconnection conductor are electrically connected to the first end and the second end of the first control source respectively. A loop formed by the first switch, the first interconnection conductor, the second switch, the second interconnection conductor and the power source is defined as a power loop. Among all the first switches, the first switch with the longer power loop is electrically connected to the first interconnection conductor with smaller inductance.

In accordance with another aspect of the present disclosure, there is provided a power module including a first power pin, a second power pin, a first control pin, a second control pin, and a plurality of switch bridge arms. The first power pin and the second power pin are configured to receive a power. The first control pin and the second control pin are configured to receive a first control signal. The plurality of switch bridge arms are electrically connected in parallel, each including a first switch, a first interconnection conductor, a second switch, and a second interconnection conductor electrically connected in series sequentially. Midpoints of the plurality of switch bridge arms are connected together. Each of the first switch and the second switch has a first terminal, a second terminal, and a third terminal. In each of the plurality of switch bridge arms, the first terminal and the second terminal of the first switch are electrically connected to the first power pin and a first terminal of the first interconnection conductor respectively. The first terminal and the second terminal of the second switch are electrically connected to a second terminal of the first interconnection conductor and a first terminal of the second interconnection conductor respectively. A second terminal of the second interconnection conductor is electrically connected to the second power pin. The third terminal of the first switch and the second terminal of the first interconnection conductor are electrically connected to the first control pin and the second control pin respectively. A loop formed by the first power pin, the first switch, the first interconnection conductor, the second switch, the second interconnection conductor and the second power pin is defined as a power loop. Among all the first switches, the first switch with the longer power loop is electrically connected to the first interconnection conductor with smaller inductance.

BRIEF DESCRIPTION OF THE DRAWINGS

FIG. 5 schematically shows the switch of the power module 10 of FIG. 2.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
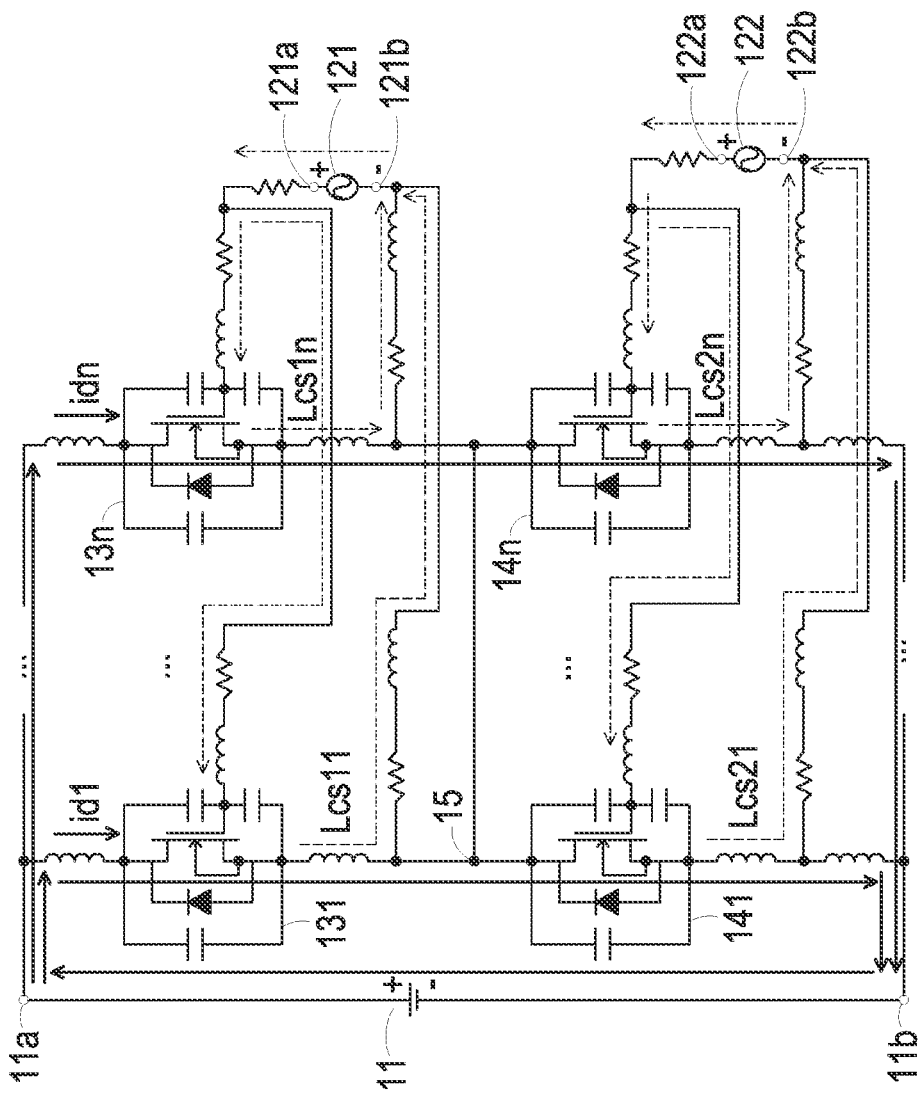
FIG. 1 is schematic circuit diagram illustrating a switch circuit according to an embodiment of the present disclosure.

FIG. 1 is schematic circuit diagram illustrating a switch circuit according to an embodiment of the present disclosure. As shown in FIG. 1, the switch circuit 1 is electrically connected to a power source 11 and a first control source 121. The power source 11 has a first end 11a and a second end 11b, and is configured to provide power. The first control source 121 has a first end 121a and a second end 121b, and is configured to provide control signal. The switch circuit 1 includes n switch bridge arms electrically connected in parallel, where n is an integer larger than 1, and midpoints of all the switch bridge arms are connected together. Each switch bridge arm includes a first switch and a second switch electrically connected in series. For example, the first switch bridge arm includes the first switch 131 and the second switch 141, and the nth switch bridge arm includes the first switch 13n and the second switch 14n. Each of the first switch and the second switch has a first terminal, a second terminal, and a third terminal. In each switch bridge arm, the first terminal of the first switch is electrically connected to the first end 11a of the power source 11, and the second terminal and third terminal of the first switch are electrically connected to the second end 121b and the first end 121a of the first control source 12 respectively. Further, the first terminal and the second terminal of the second switch are electrically connected to the second terminal of the first switch and the second end 11b of the power source 11 respectively. A loop formed by the first switch, the second switch and the power source 11 is defined as a power loop (depicted by solid arrow lines in FIG. 1). A loop formed by the first control source 121 and the second terminal and third terminal of the first switch is defined as a first control loop (depicted by dashed arrow lines in FIG. 1). A first mutual inductance is formed between the power loop and the first control loop. In an embodiment, the switch is a field-effect transistor, and the first, second, and third terminals are a drain, a source, and a gate respectively, but not limited thereto.

In an embodiment, the switch circuit 1 is further electrically connected to a second control source 122 having a first end 122a and a second end 122b. In each switch bridge arm, the second terminal and the third terminal of the second switch are electrically connected to the second end 122b and the first end 122a of the second control source 122 respectively. A loop formed by the second control source 122 and the second terminal and the third terminal of the second switch is defined as a second control loop (depicted by dashed arrow lines in FIG. 1). A second mutual inductance is formed between the power loop and the second control loop.

In addition, the switch bridge arms of the switch circuit 1 further include a plurality of first interconnection conductors Lcs11 . . . Lcs1n and a plurality of second interconnection conductors Lcs21 . . . Lcs2n. In other words, each switch bridge arm further includes one first interconnection conductor and one second interconnection conductor, and the first switch, the first interconnection conductor, the second switch, and the second interconnection conductor are electrically connected in series sequentially to form the switch bridge arm. The first interconnection conductors Lcs11 . . . Lcs1n are electrically connected to the first switches 131 . . . 13n one-to-one. The second interconnection conductors Lcs21 . . . Lcs2n are electrically connected to the second switches 141 . . . 14n one-to-one. Each of the plurality of interconnection conductors Lcs11 . . . Lcs1n and Lcs21 . . . Lcs2n is electrically connected to the second terminal of the corresponding switch and is shared by the power and control loops of the corresponding switch. Taking the first switch 131 and the corresponding first interconnection conductor Lcs11 as an example, a first terminal of the first interconnection conductor Lcs11 is electrically connected to the second terminal of the first switch 131, and a second terminal of the first interconnection conductor Lcs11 is electrically connected to the first terminal of the second switch 141 and the second end 121b of the first control source 121. Moreover, under this circumstance, regarding each switch bridge arm, the power loop is formed by the first switch, the first interconnection conductor, the second switch, the second interconnection conductor and the power source 11. The first control loop is formed by the first control source 121, the first interconnection conductor, and the second terminal and the third terminal of the first switch. The second control loop is formed by the second control source 122, the second interconnection conductor, and the second terminal and the third terminal of the second switch.

The mutual inductance and the interconnection conductor stated above are regarded as the flux-coupled common source inductance and the shared-path common source inductance respectively, which are both common source inductances actually. Through designing at least one of the mentioned common source inductances, the switch circuit 1 of the present disclosure is capable of balancing the dynamic currents flowing through the switches, which would be described in detail as follows.

In a first embodiment, among all the first switches 131 . . . 13n, the first switch with the longer power loop has the smaller first mutual inductance. Similarly, among all the second switches 141 . . . 14n, the second switch with the longer power loop has the smaller second mutual inductance. Thereby, the dynamic currents flowing through the switches 131 . . . 13n and 141 . . . 14n respectively are balanced. Taking the first switches 131 and 13n as an example, since the power loop of the first switch 13n is longer than the power loop of the first switch 131, the current flowing through the first switch 13n tends to be smaller than the current flowing through the first switch 131. In order to reverse this tendency and balance the currents flowing through the first switch 131 and the first switch 13n, the first mutual inductance of the first switch 13n is designed to be smaller than the first mutual inductance of the first switch 131. As the first mutual inductance of the first switch 13n is designed to be smaller than the first mutual inductance of the first switch 131, the voltage drop across the trace of the first control loop of the first switch 13n is smaller than that of the first switch 131. The first switch 131 and the first switch 13n are connected to the same control source, and the polarity of the voltage drop across the trace of the first control loop of the first switch 13n and the polarity of the voltage drop across the trace of the first control loop of the first switch 131 are both opposite to the polarity of the first control source 121, so the voltage between the third terminal and the second terminal of the first switch 13n is larger than the voltage between the third terminal and the second terminal of the first switch 131. Therefore, the resistance of the first switch 131n is smaller than that of the first switch 131, which can make the current flowing through the first switch 13n increase and make the current flowing through the first switch 131 decrease. Consequently, the dynamic currents id1 and idn flowing through the first switches 131 and 13n respectively are balanced. Further, the value of the first mutual inductance is determined by the relative position of the power loop and the first control loop as well as the loop areas of the power loop and the first control loop. Similarly, the value of the second mutual inductance is determined by the relative position of the power loop and the second control loop as well as the loop areas of the power loop and the second control loop.

In a second embodiment, among all the first switches 131 . . . 13n, the first switch with the longer power loop is electrically connected to the first interconnection conductor with smaller inductance. Among all the second switches 141 . . . 14n, the second switch with the longer power loop is electrically connected to the second interconnection conductor with smaller inductance. Thereby, the dynamic currents flowing through the switches 131 . . . 13n and 141 . . . 14n respectively are balanced. Taking the first switches 131 and 13n as an example, since the power loop of the first switch 13n is longer than the power loop of the first switch 131, the current flowing through the first switch 13n tends to be smaller than the current flowing through the first switch 131. In order to reverse this tendency and balance the currents flowing through the first switch 131 and the first switch 13n, the inductance of the first interconnection conductor Lcs1n electrically connected to the first switch 13n is designed to be smaller than the inductance of the first interconnection conductor Lcs11 electrically connected to the first switch 131. As the inductance of the first interconnection conductor Lcs1n is designed to be smaller than the inductance of the first interconnection conductor Lcs11, the voltage across the first interconnection conductor Lcs1n is smaller than voltage across the first interconnection conductor Lcs11. The first switch 131 and the first switch 13n are connected to the same control source, and the polarity of the voltage across the first interconnection conductor Lcs1n and the polarity of the voltage across the first interconnection conductor Lcs11 are both opposite to the polarity of the first control source 121, so the voltage between the third terminal and the second terminal of the first switch 13n is larger than voltage between the third terminal and the second terminal of the first switch 131. Therefore, the resistance of the first switch 131n is smaller than that of the first switch 131, which can make the current flowing through the first switch 13n increase and make the current flowing through the first switch 131 decrease. Consequently, the dynamic currents id1 and idn flowing through the first switches 131 and 13n respectively are balanced. Further, the inductance of the interconnection conductor is determined by the dimensions (e.g., shape, length, and thickness) of the interconnection conductor.

In an embodiment, the mutual inductance and the interconnection conductor may both taken into consideration to balance the dynamic currents, and the principle of designing the mutual inductance and the interconnection conductor is similar to that described in the first and second embodiments.

Accordingly, the switch circuit 1 of the present disclosure is capable of balancing the dynamic currents flowing through the switches 131 . . . 13n and 141 . . . 14n based on the common source inductance. Due to the balanced dynamic currents, the reliability of the switch circuit 1 is greatly improved.

Figure 2:
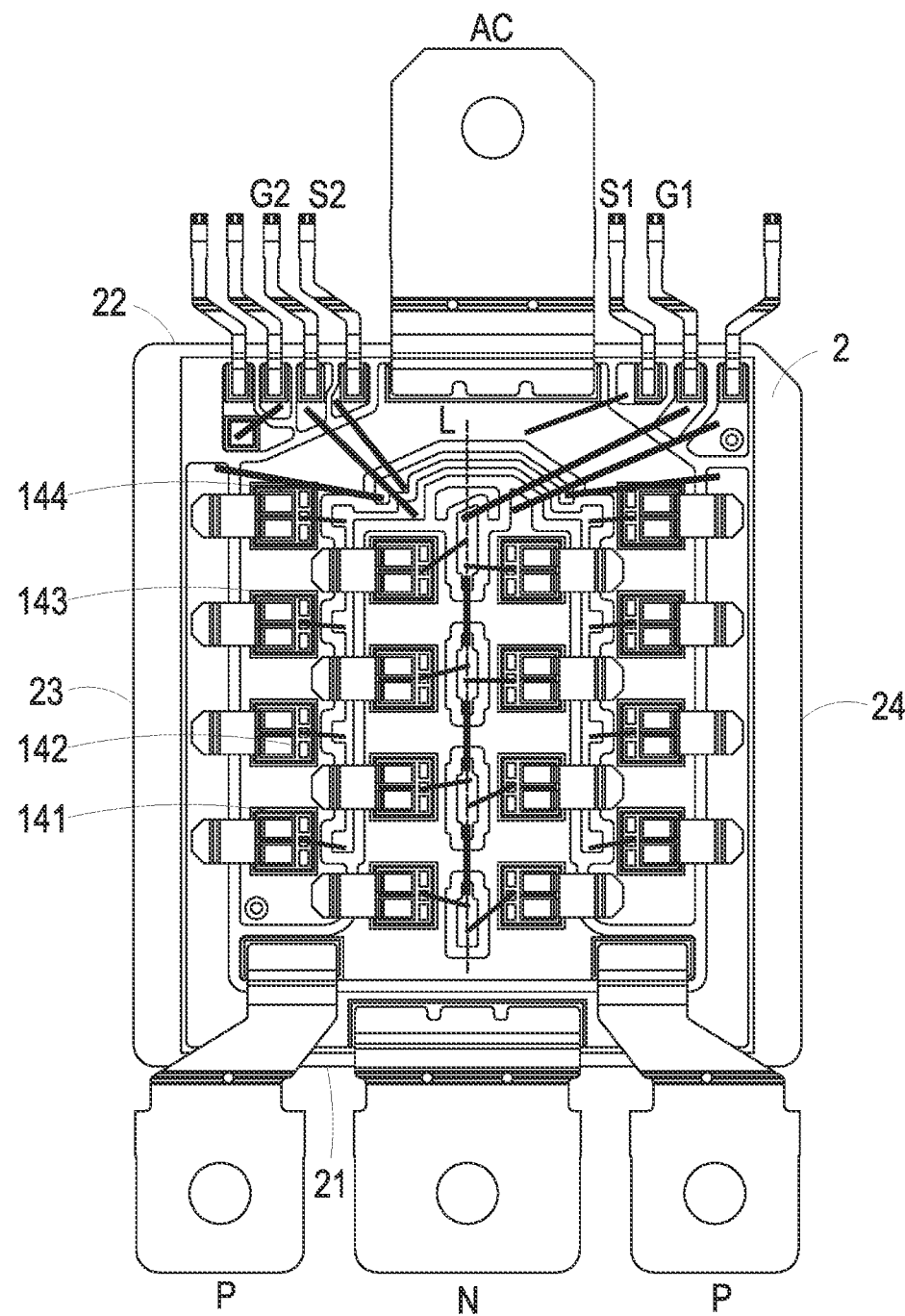
FIG. 2 is a schematic view illustrating a power module according to an embodiment of the present disclosure.

FIG. 2 is a schematic view illustrating a power module according to an embodiment of the present disclosure. The power module 10 may be regarded as a packaging implementation of the switch circuit 1. As shown in FIG. 2, the power module 10 includes first power pins P, a second power pin N, a third power pin AC, a first control pin G1, a second control pin S1, and the n switch bridge arms of the switch circuit 1. The terminal of the switch is electrically connected to the power or control source through the corresponding pin. In particular, the first power pin P and the second power pin N are configured to be electrically connected to the first end 11a and the second end 11b of the power source 11 respectively for receiving the power. The third power pin AC is electrically connected to a node 15 between the first and second switch (i.e., the midpoint of the switch bridge arm). The first control pin G1 and the second control pin S1 are electrically connected to the first end 121a and the second end 121b of the first control source 121 for receiving a first control signal. In an embodiment, the power module 10 further includes a third control pin G2 and a fourth control pin S2. The third control pin G2 and the fourth control pin S2 are electrically connected to the first end 122a and the second end 122b of the second control source 122 for receiving a second control signal. In an embodiment, the power module 10 further includes a substrate 2, and all the switches and pins mentioned above are all disposed on the substrate 2.

In an embodiment, the substrate 2 is a circuit board having a first edge 21, a second edge 22, a third edge 23, and a fourth edge 24. The first edge 21 is opposite to the second edge 22, and the third edge 23 is opposite to the fourth edge 24. The first and second power pins P and N are disposed at the first edge 21. The third power pin AC, the first control pin G1, the second control pin S1, the third control pin G2, and the fourth control pin S2 are disposed at the second edge 22. All the first switches are disposed along a central line L between the third and fourth edges 23 and 24, a part of the second switches is disposed between the first switches and the third edge 23, and the other part of the second switches is disposed between the first switches and the fourth edge 24.

Figure 3:
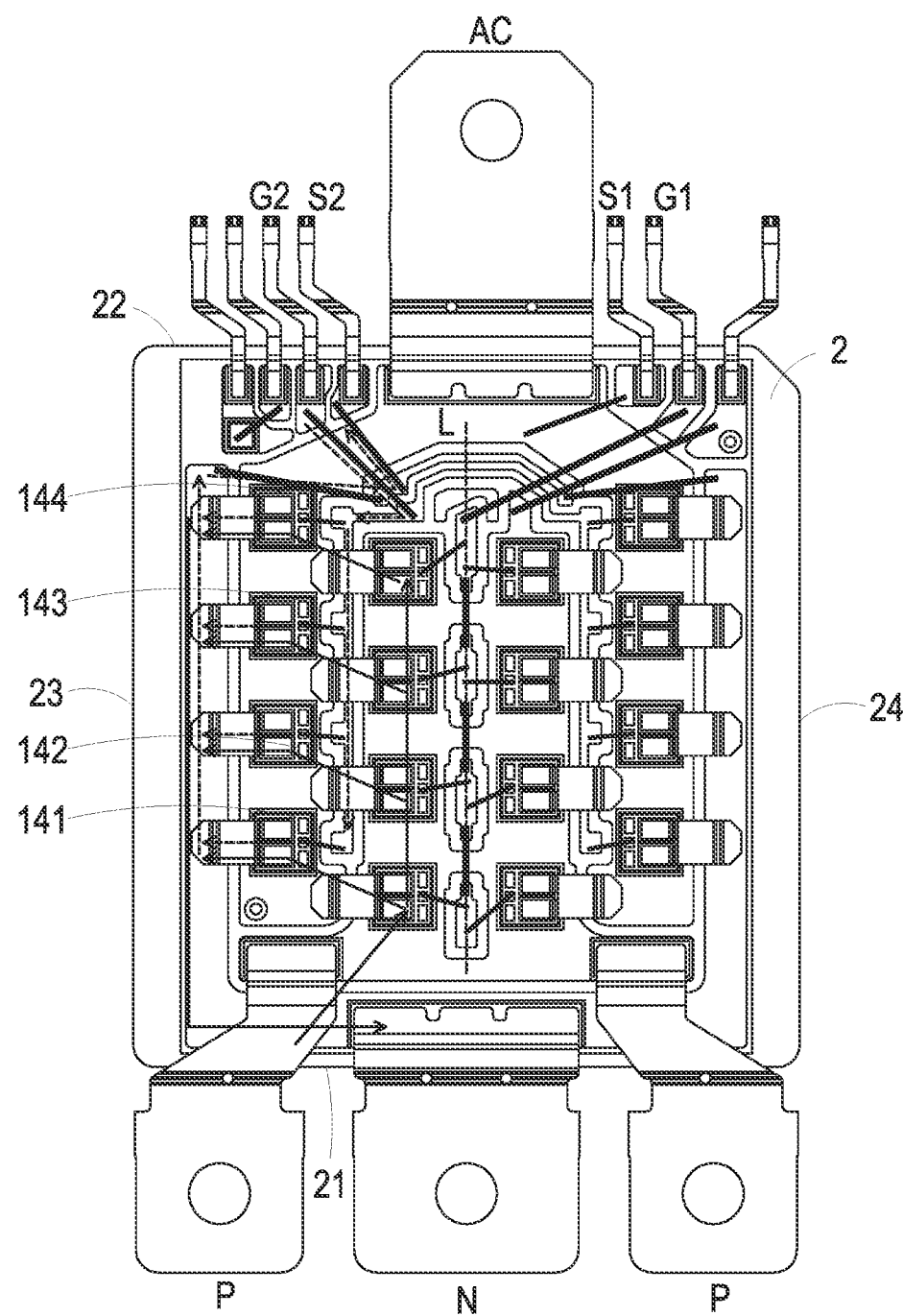
FIG. 3 schematically shows the power loop and the second control loop of the second switch in FIG. 2.

In FIG. 2, the circuit diagram regarding the switches at the left or right edge of the central line L is corresponding to the circuit diagram shown in FIG. 1 in the case of n equal to 4. Taking the switches at the left edge of the central line L as an example, the power loop and the second control loop of the second switches 141, 142, 143 and 144 are depicted by solid and dashed arrow lines respectively in FIG. 3. In this embodiment, the substrate is a DBC (direct bonded copper). Taking FIG. 3 as an example, for the second switch 144, the power loop of the second switch 144 is the longest among all the second switches 141, 142, 143 and 144. On the other hand, the second control loop of the second switch 144 is the smallest. Since the mutual inductance is proportional to the loop area of the second control loop, the second switch 144 has the smallest mutual inductance between the power loop and second control loop. At the same time, the trace length of the second switch 144, which is shared by the power loop and second control loop, including the copper clip on the die and the DBC trace on the left is the smallest among the second switches 141, 142, 143 and 144. The common source inductance of a switch is proportional to the shared trace length. As a result, the second switch 144 that has the largest power loop has the smallest common source inductance and mutual inductance.

Figure 4A:
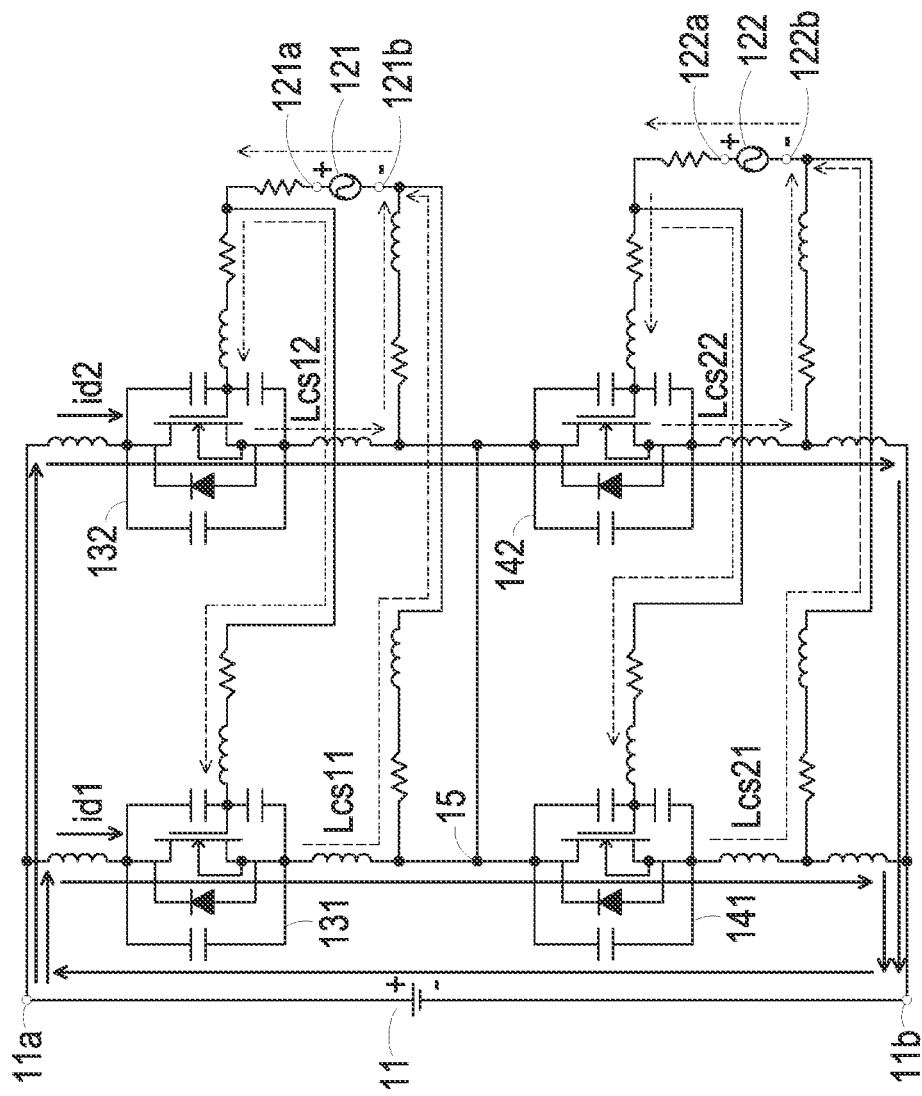
FIG. 4A shows the switch circuit of FIG. 1 in the case of n equal to 2.
Figure 4B:
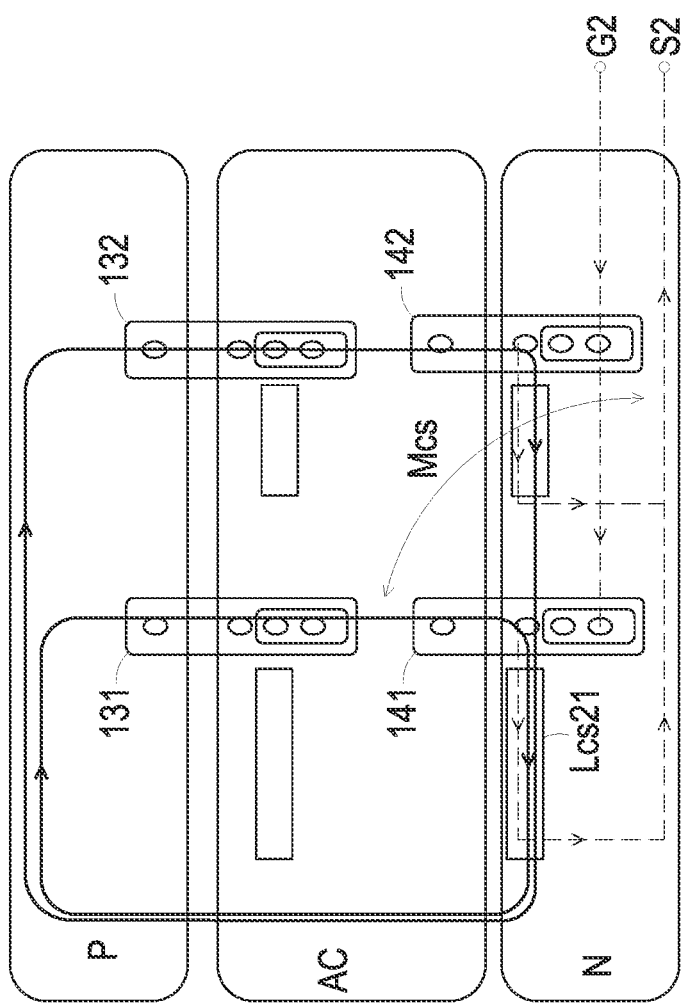
FIG. 4B is a schematic layout showing a mutual inductance and an interconnection conductor corresponding to a certain switch.

For ease of understanding the mutual inductance and the interconnection conductor, FIG. 4A shows the switch circuit of FIG. 1 in the case of n equal to 2, and FIG. 4B is a schematic layout showing the second mutual inductance Mcs of the second switch 141 and the second interconnection conductor Lcs21 electrically connected to the second switch 141. In FIG. 4B, the power loop and the second control loop of the second switches 141 and 142 are depicted by solid and dashed arrow lines respectively. The substrate is a PCB (printed circuit board) in this embodiment. Taking FIG. 4B as an example, for the second switch 141, the power loop of the second switch 141 is smaller than the second switch 142. On the other hand, the second control loop of the second switch 141 is larger. Since the mutual inductance is proportional to the loop area of the second control loop, the second switch 141 has higher mutual inductance between the power loop and second control loop. At the same time, the PCB trace length of the second switch 141, which is shared by the power loop and second control loop, is longer. The common source inductance of a switch is proportional to the shared trace length. As a result, the second switch 141 that has the smaller power loop has the larger common source inductance and mutual inductance. Please refer to FIG. 4B. In an embodiment, the power source and the control source may be disposed at the left and right edges of the switch circuit respectively (not shown). In an embodiment, the switch is a field-effect transistor, and the four terminals of the switch from the top to bottom are the drain terminal, the source terminal, the other source terminal, and the gate terminal respectively.

FIG. 5 schematically shows the switch of the power module 10 of FIG. 2. In an embodiment, as shown in FIG. 5, the switch is a field-effect transistor. The first terminal of the switch is a drain terminal located on the back (not shown). The second terminals B of the switch are source terminals. The third terminal A of the switch is a gate terminal.

From the above descriptions, the present disclosure provides a switch circuit and a power module capable of balancing the dynamic currents flowing through the switches based on the common source inductance. Due to the balanced dynamic currents, the reliability of the switch circuit and the power module is greatly improved.

While the disclosure has been described in terms of what is presently considered to be the most practical and preferred embodiments, it is to be understood that the disclosure needs not be limited to the disclosed embodiment.

What is claimed is:

1. A switch circuit, electrically connected to a power source and a first control source, each of the power source and the first control source having a first end and a second end, and the switch circuit comprising:
   a plurality of switch bridge arms electrically connected in parallel, each comprising a first switch and a second switch electrically connected in series, wherein midpoints of the plurality of switch bridge arms are connected together, and each of the first switch and the second switch has a first terminal, a second terminal, and a third terminal, wherein in each of the plurality of switch bridge arms, the first terminal of the first switch is electrically connected to the first end of the power source, the second terminal and the third terminal of the first switch are electrically connected to the second end and the first end of the first control source respectively, the first terminal and the second terminal of the second switch are electrically connected to the second terminal of the first switch and the second end of the power source respectively, a loop formed by the first switch, the second switch and the power source is defined as a power loop, a loop formed by the first control source and the second terminal and the third terminal of the first switch is defined as a first control loop, and a first mutual inductance is formed between the power loop and the first control loop,
   wherein among all the first switches, the first switch with the longer power loop has the smaller first mutual inductance.

2. The switch circuit according to claim 1, further electrically connected to a second control source having a first end and a second end, wherein in each of the plurality of switch bridge arms, the second terminal and the third terminal of the second switch are electrically connected to the second end and the first end of the second control source respectively, a loop formed by the second control source and the second terminal and the third terminal of the second switch is defined as a second control loop, and a second mutual inductance is formed between the power loop and the second control loop,
   wherein among all the second switches, the second switch with the longer power loop has the smaller second mutual inductance.

3. The switch circuit according to claim 2, wherein a value of the second mutual inductance is determined by a relative position between the power loop and the second control loop as well as loop area of the power loop and the second control loop.

4. The switch circuit according to claim 1, wherein a value of the first mutual inductance is determined by a relative position between the power loop and the first control loop as well as loop area of the power loop and the first control loop.

5. A switch circuit, electrically connected to a power source and a first control source, each of the power source and the first control source having a first end and a second end, and the switch circuit comprising:

a plurality of switch bridge arms electrically connected in parallel, each comprising a first switch, a first interconnection conductor, a second switch, and a second interconnection conductor electrically connected in series sequentially, wherein midpoints of the plurality of switch bridge arms are connected together, and each of the first switch and the second switch has a first terminal, a second terminal, and a third terminal, wherein in each of the plurality of switch bridge arms, the first terminal and the second terminal of the first switch are electrically connected to the first end of the power source and a first terminal of the first interconnection conductor respectively, the first terminal and the second terminal of the second switch are electrically connected to a second terminal of the first interconnection conductor and a first terminal of the second interconnection conductor respectively, a second terminal of the second interconnection conductor is electrically connected to the second end of the power source, the third terminal of the first switch and the second terminal of the first interconnection conductor are electrically connected to the first end and the second end of the first control source respectively, a loop formed by the first switch, the first interconnection conductor, the second switch, the second interconnection conductor and the power source is defined as a power loop, wherein among all the first switches, the first switch with the longer power loop is electrically connected to the first interconnection conductor with smaller inductance.

6. The switch circuit according to claim 5, further electrically connected to a second control source having a first end and a second end, wherein in each of the plurality of switch bridge arms, the third terminal of the second switch and the second terminal of the second interconnection conductor are electrically connected to the first end and the second end of the second control source respectively, wherein among all the second switches, the second switch with the longer power loop is electrically connected to the second interconnection conductor with smaller inductance.

7. The switch circuit according to claim 6, wherein a loop formed by the second control source, the second interconnection conductor, and the second terminal and the third terminal of the second switch is defined as a control loop, and a second mutual inductance is formed between the power loop and the control loop, wherein among all the second switches, the second switch with the longer power loop has the smaller second mutual inductance.

8. The switch circuit according to claim 5, wherein a loop formed by the first control source, the first interconnection conductor, and the second terminal and the third terminal of the first switch is defined as a control loop, and a first mutual inductance is formed between the power loop and the control loop, wherein among all the first switches, the first switch with the longer power loop has the smaller first mutual inductance.

* * * * *